(12) United States Patent
Dellinger

(10) Patent No.: US 7,102,237 B1
(45) Date of Patent: Sep. 5, 2006

(54) ASIC CUSTOMIZATION WITH PREDEFINED VIA MASK

(75) Inventor: Eric Dellinger, San Jose, CA (US)

(73) Assignee: Lightspeed Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 10/447,466

(22) Filed: May 28, 2003

(51) Int. Cl.
*H01L 23/48* (2006.01)
*H01L 27/10* (2006.01)

(52) U.S. Cl. .............. 257/773; 257/211; 257/758

(58) Field of Classification Search ........ 257/207–211, 257/390, 391, 758, 773, 774, 776
See application file for complete search history.

(56) References Cited

U.S. PATENT DOCUMENTS

| 6,100,589 A | * | 8/2000 | Tanaka ................. 257/758 |
| 6,242,767 B1 | | 6/2001 | How et al. |
| 6,919,637 B1 | * | 7/2005 | He et al. ................. 257/758 |

OTHER PUBLICATIONS

TSMC, "IP", available at http://www.tsmc.com/tsmcdotcom/IPListingAction.do, visited Sep. 17, 2002, p. 1 of 2.
TSMC, "TSMC IP & Library Alliance", brochure (Apr. 2002), 4 pages.
Artisan Components, Inc.—Products, available at http:/www.artisan.com/products, visited Sep. 17, 2002, 3 pages.
Artisan Components, Inc.—Standard Cells, available at http:/www.artisan.com/products/stdcells/, visited Sep. 17, 2002, 3 pages.
Artisan Components, Inc.—Standard Cell Libraries, availabel at http:/www.artisan.com/products/stdcells/std_data.html, visited Sep. 17, 2002, 2 pages.
Artisan Components, Inc.—Standard Cell Libraries SAGE-X, available at http:/www.artisan.com/products/stdcells/std_data-x.html, visited Sep. 17, 2002, 2 pages.

* cited by examiner

*Primary Examiner*—Hung Vu
(74) *Attorney, Agent, or Firm*—Haynes Beffel & Wolfeld LLP

(57) ABSTRACT

Disclosed herein is an integrated circuit customized by mask programming using custom conducting layers and via layers interspersed with the custom conducting layers, where the via layers are defined by masks designed prior to receiving a custom circuit design.

2 Claims, 4 Drawing Sheets

ASIC CUSTOMIZATION WITH PREDEFINED VIA MASK

BACKGROUND

Use of ASICs (application specific integrated circuits) has become widespread in the semiconductor industry as giving circuit design engineers a relatively high amount of functionality in a relatively small package. In particular, ASICs are customizable integrated circuits that are customized to implement a circuit specified by a design engineer (a "custom circuit design"). The term "ASIC" actually refers to a variety of integrated circuit (IC) styles that vary in degree of customizability, including standard cells, gate arrays, and FPGAs. As a general rule, the more customization that is required, the more expensive the ASIC will be and the longer the ASIC will take to fabricate.

In forming ASICs generally, several layers will be required. FIG. 1 shows a partial cross-sectional view of a generic integrated circuit. First, active layers 110 are formed on a semiconductor substrate. The active layers 110 include devices such as transistors and diodes. Many active layer devices are formed independently of one another, i.e., they are not connected to form a circuit. Thus, once active layers 110 are formed, conducting layers, which are often composed of a metal such as aluminum or copper, are formed over the active layers to interconnect the devices, thereby forming a circuit. Several conducting layers may be required to completely interconnect the devices to form a useful circuit. Four conducting layers, M1 120, M2 130, M3 140, and M4 150, are shown in FIG. 1. Of course, different types of ICs or ICs fabricated using different processes may require more or less than four conducting layers for circuit interconnection.

In between each conducting layer is an insulating layer 115, 125, 135, 145 as shown in FIG. 1. Insulating layers are present to prevent shorts between conducting layers. To interconnect the conducting layers, vias 116 are formed through the insulating layers and are filled with conducting material (e.g., metal). Accordingly, the insulating layers are also sometimes referred to as "via layers."

In forming the structure of FIG. 1, after the active layers 110 are formed, an insulating layer 115 is formed over the active layers 110, for instance, by growth or deposition of insulating material. Next, a masking step is utilized to form vias in the insulating layer, as is generally known in the art. Such masking often entails depositing a photoresist layer and patterning the layer using a mask and ultra-violet light, enabling removal of only selected portions of the photoresist, and then etching the insulating layer in accordance with the photoresist pattern. After forming the vias, a conducting layer is deposited and then patterned using a similar masking process, so that metal (or other conductor) remains only in desired locations. The process is repeated for each insulating layer and conducting layer required to be formed.

Thus each conducting layer required to be formed generally demands at least two masking steps: one step to form vias through the insulating layer to connect to the layer below and one step to form connection wires or lines. Unfortunately, each mask step required generally entails significant time and expense. Moreover masks for vias generally cost twice as much as masks for conductor. Nonetheless, typical mask-programmed ASICs, such as gate arrays and standard cells, require a new mask design for each insulating and conducting layer.

One solution to minimizing both the time and monetary costs of customization is the FPGA (Field Programmable Gate Array). FPGAs utilize a predefined generic routing structure and is prefabricated through all layers. The routing structure is formed of a plurality of intersecting wires, many of which are coupled to vias to connect to lower layers. At each intersection is either a fuse or a programmable RAM bit. To customize the FPGA, either selected fuses are stressed to melt and form connections or the RAM bits are selectively programmed to form connections. Since the entire FPGA structure is fixed by the manufacturer, no additional mask steps are required and FPGA programming can actually be done by the IC designer with equipment and software at his or her own place of business. But despite rapid and easy customization, FPGAs currently available have drawbacks. FPGAs are often used in intermediate design steps for test purposes, but cannot often be used in a final product: because of the predefined nature of the FPGA routing structure and base array, an FPGA often will not meet the performance expectations of the final product (e.g., timing) and thus frequently has only limited use in test situations.

In sum, in implementing circuit designs with an ASIC, flexibility of design, rapid customization time, and low cost are all important considerations to the engineer using an ASIC. Therefore, any customizable circuit that can reduce customization time while minimizing costs is desirable.

SUMMARY

Disclosed herein is an integrated circuit customized using custom conducting layers and via layers, which are interspersed with the custom conducting layers, where the via layers are defined by at least one predefined via mask. In accordance with an embodiment of the invention, the predefined via masks, and therefore the via layers, include a plurality of parallel via tracks each including a plurality of vias. The via tracks are spaced far enough apart to allow for placement therebetween of at least one predesignated conductor track. In one embodiment the via tracks are spaced so that two conductor tracks can be placed between via tracks and so that every third track is a via track.

In some embodiments the same predefined via mask is used for all via layers. In other embodiments, several predefined via masks can be used for various respective via layers.

Embodiments of the invention will reduce costs associated with mask programming (customizing) ICs since custom via layers tend to be costly relative to custom conducting layers. Embodiments of the invention may further reduce production time since the number of masks required to be designed will be reduced. Embodiments of the invention may also reduce cross-talk and minimize other deep sub-micron effects.

BRIEF DESCRIPTION OF THE DRAWINGS

The present invention is described with respect to particular exemplary embodiments thereof and reference is accordingly made to the drawings, which are not necessarily drawn in scale, and in which.

DETAILED DESCRIPTION

Disclosed herein and in accordance with an embodiment of the invention is a mask programmed ASIC where some or all of the conducting layers are customized, requiring custom masks, but where at least some of the via masks are predefined. As used herein, "predefined" means defined prior to receiving a custom circuit design for implementation on an ASIC device.

Figure 1:
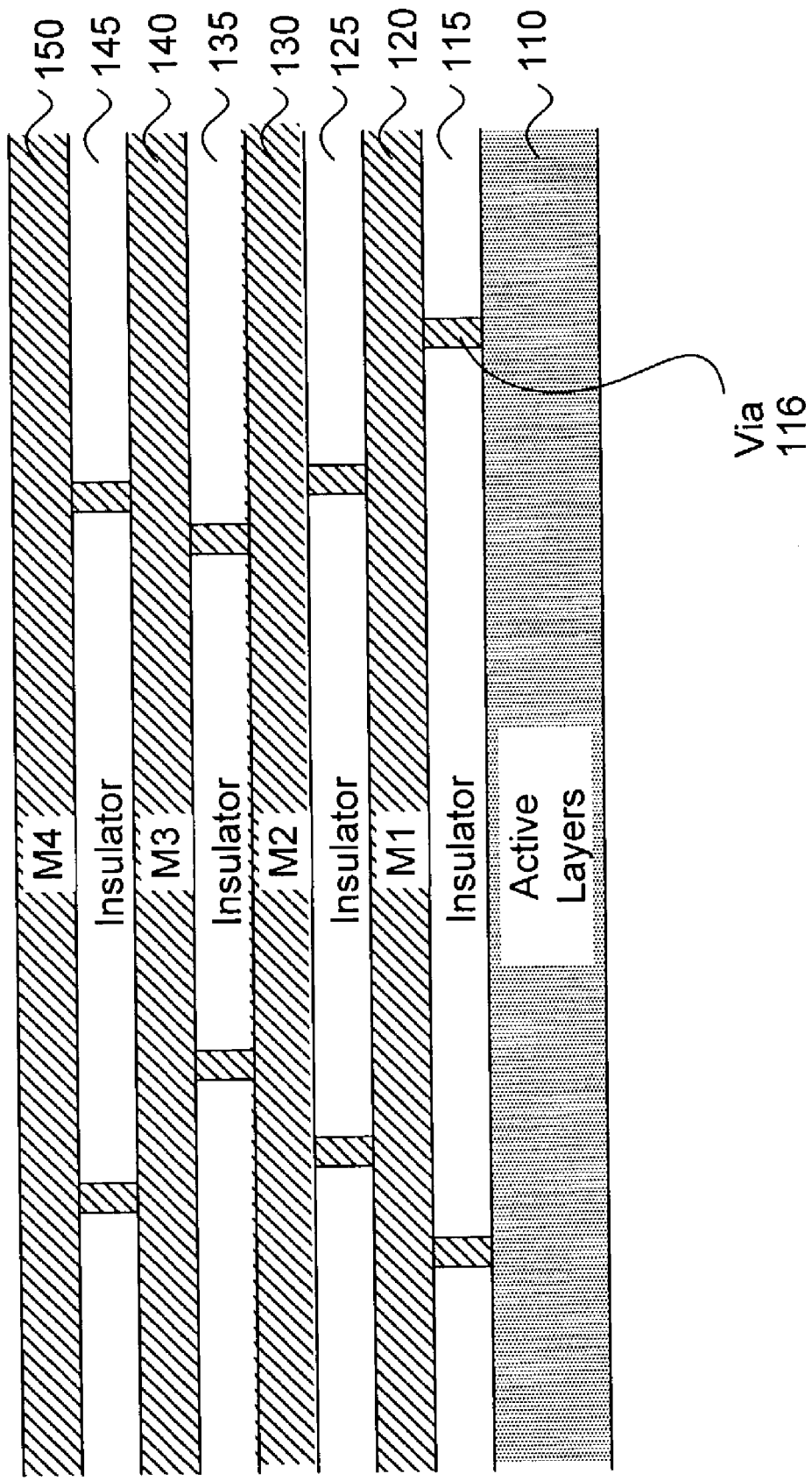
FIG. 1 is a partial cross-sectional view of a generic integrated circuit.
Figure 2:
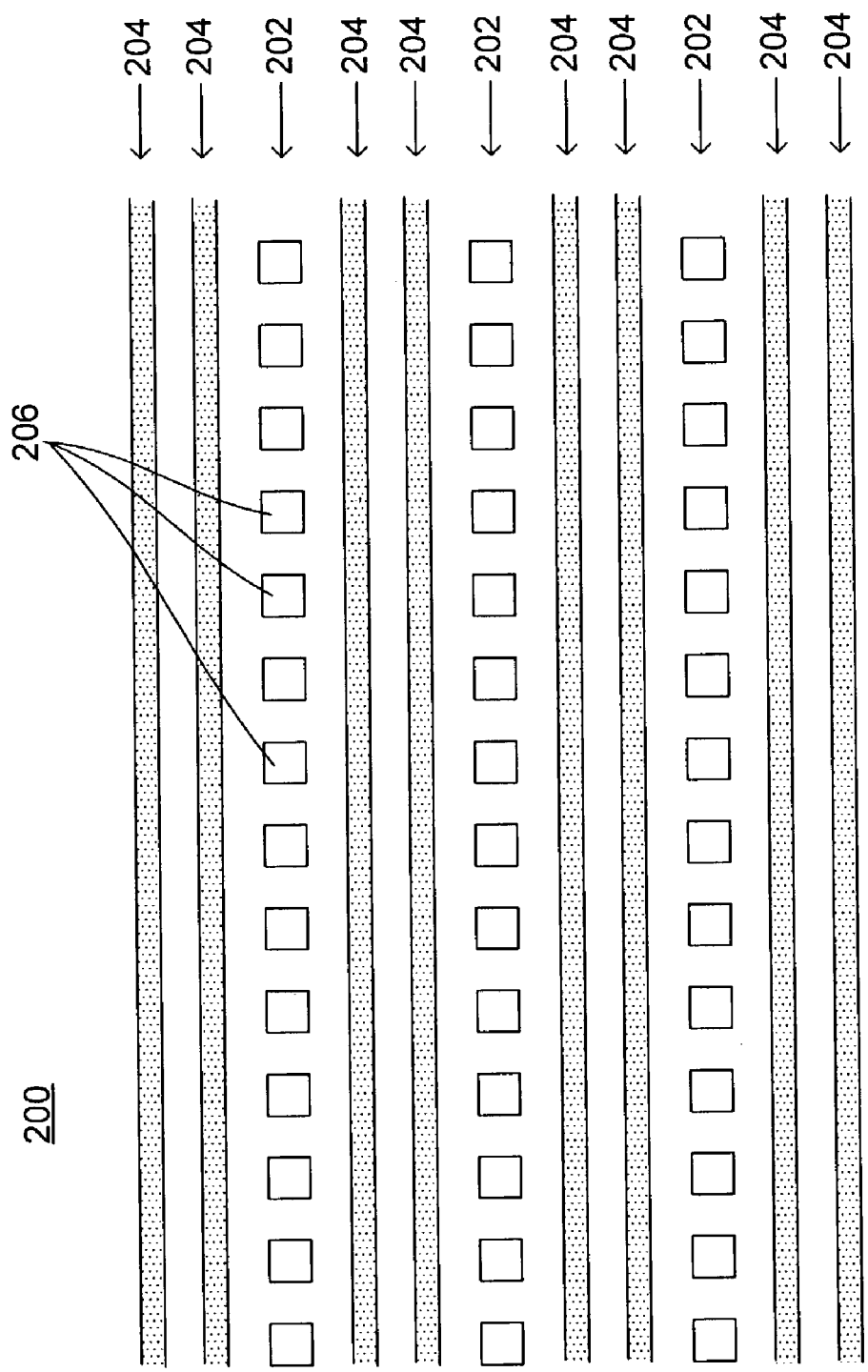
FIG. 2 is a partial plan view of a via layer and the predesignated tracks of a conducting layer in accordance with an embodiment of the invention.

Referring to FIG. 2, an embodiment of a generic routing design 200 in accordance with the invention is shown. The design 200 includes a number of parallel tracks 202, 204 for vias and for conducting material (e.g., metal). Via tracks 202 contain a number of vias 206 to be formed in a via layer. Conductor tracks 204 are generally used as areas designated for the primary placement of metal (or other conductor) in the conducting layer, but are not necessarily completely filled with metal upon customization. As should be understood then, conductor tracks 204 are shown to represent the predesignated conductor areas, and are used in designing the masks but do not actually appear on any mask or the IC. Accordingly, FIG. 2 illustrates a two-layer view, a first via layer through which vias 206 are formed and a second conducting layer formed over the via layer. As will be understood by those as skilled in the art, FIG. 2 also represents a predefined via mask in accordance with an embodiment of the invention.

Figure 3:
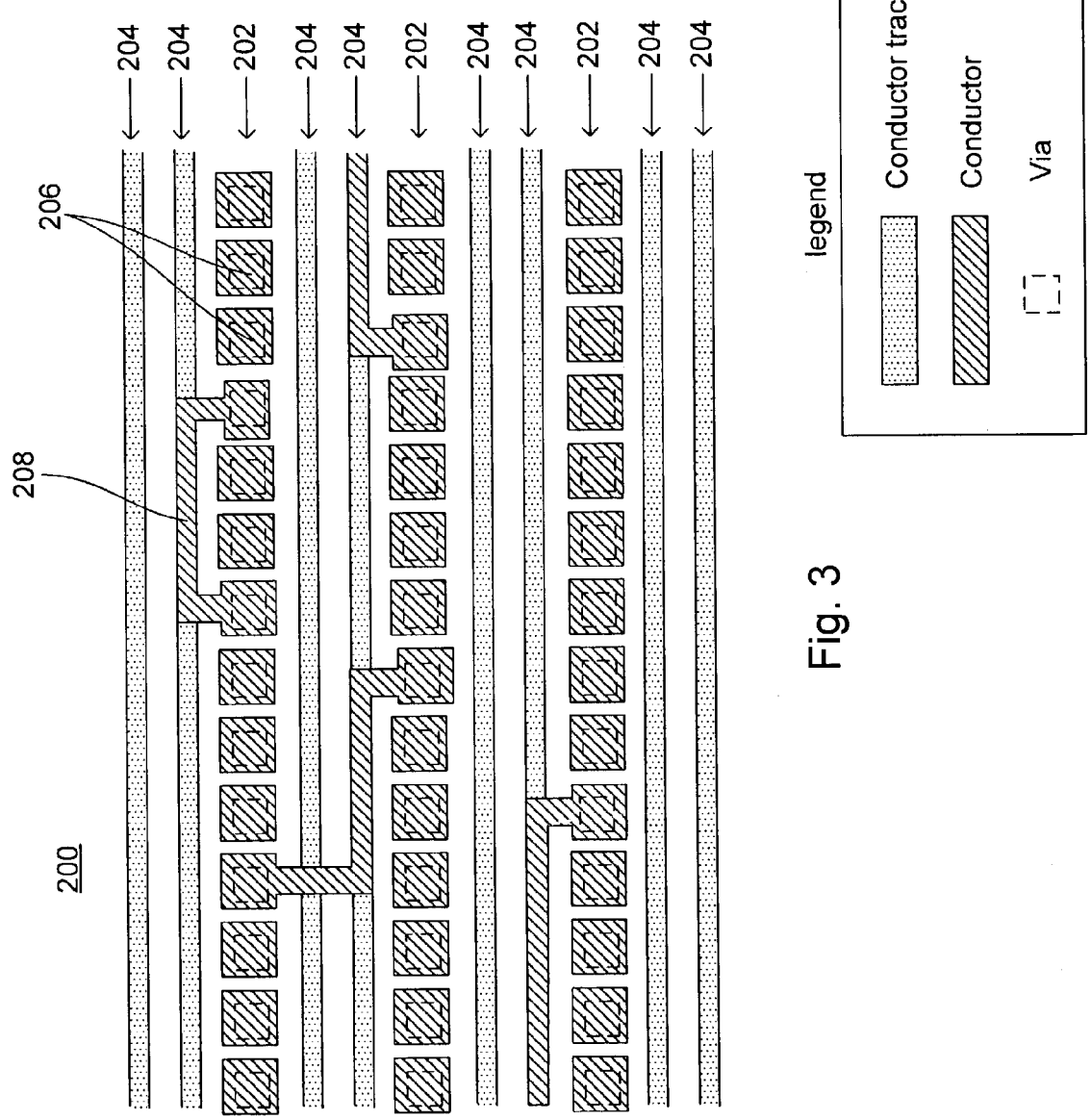
FIG. 3 shows the same view as FIG. 2 with the addition of conductor selectively lain in the predesignated conductor tracks.

FIG. 3 illustrates the structure of FIG. 2 with conductor metal 208 selectivity lain in the conductor tracks 204 and connecting to selected vias 206 to form a custom circuit. Vias that are connected to the lain conductor are shown in phantom.

As shown in FIGS. 2 and 3, in one embodiment there are two conductor tracks 204 between via tracks 202 so that every third track is a via track 202. Although other embodiments may include fewer or more than two conductor tracks between via tracks, inclusion of more than two conductor tracks may result in inaccessibility of vias from middle conductor tracks upon conductor tracks placement.

Vias are spaced apart from each other and the tracks depending upon manufacturing processes and limitations used to fabricate the IC. For instance, one fabrication process requires that unused via's be "capped" so that conductor extends out and around the actual via, as shown in FIG. 3. In addition, some processes require that in connecting to a particular via there be some amount of conductor overhang around the via as also shown in FIG. 3. Thus the spacing is determined so that vias and tracks are spaced apart at least far enough to avoid shorts.

Figure 4:
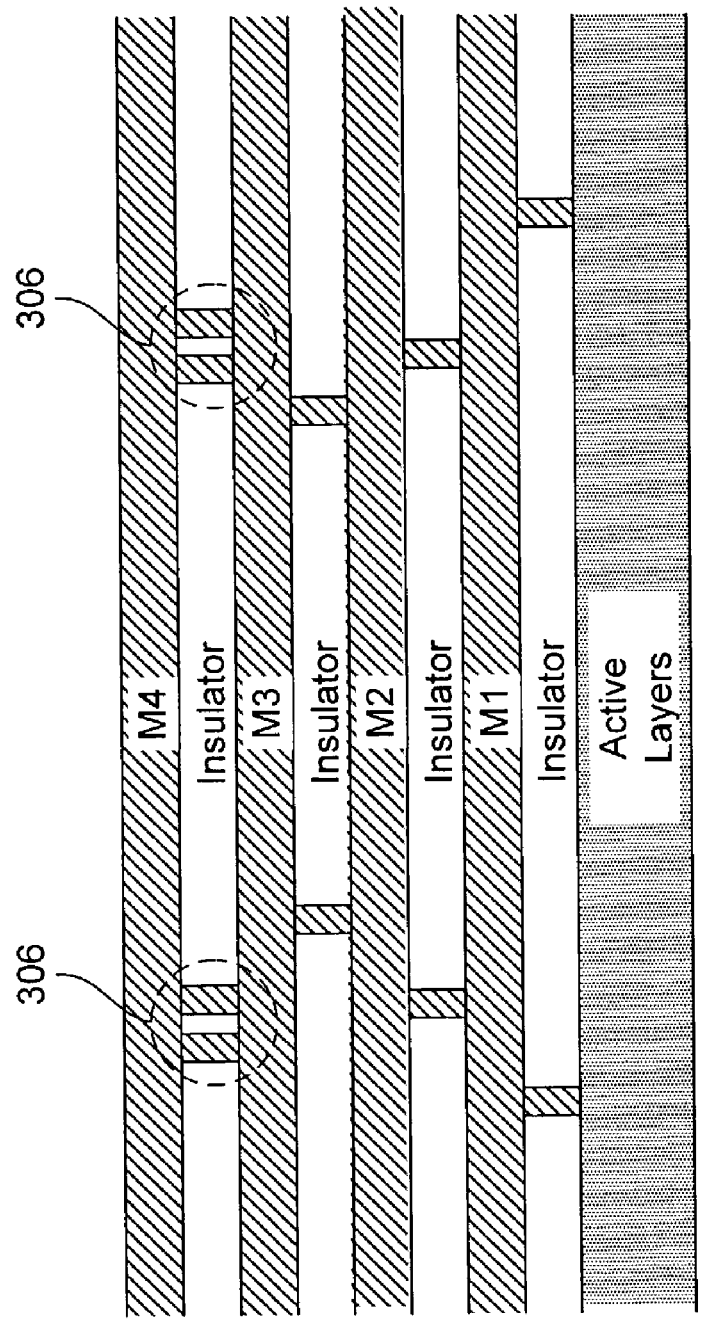
FIG. 4 is a partial cross-sectional view of an integrated circuit in accordance with one embodiment of the invention having a via layer with double vias.

In some embodiments, via masks are designed with "double vias"—that is two vias adjacent to one another in parallel. FIG. 4 shows double vias 306. As shown in FIG. 4, not all layers will include double vias, although in some embodiments all layers will include double vias. If during the manufacturing process one via is not formed correctly and is unusable, the adjacent parallel via can be used. Such redundancy will enhance yield.

Although FIGS. 2 and 3 illustrate only two layers, a via layer and a conducting layer, it should be understood by those of skill in the art that most ASICs require more than these two layers and will in fact require several conducting layers with interspersed via layers. In some embodiments all via masks used for all the via layers are also predefined, while other embodiments may use some predefined via layers and some custom via layers.

In addition, a plurality of different predefined via masks may be devised for use in accordance with various embodiments of the invention. For instance, one mask may be selected for all via layers for a particular custom circuit. For a different custom circuit, however, two or more predefined via masks may be selected for the various via layers. The differing masks are chosen in some embodiments for different routing densities. For instance, a sparser via array will allow more routing (although some via routing may be lost). In contrast, a more dense via array may be desirable where longer routes will be more common, especially on upper conducting layers. For longer routes, an embodiment in accordance with the invention has the advantage that the via tracks aid in keeping the conductor tracks spaced apart thereby minimizing capacitive coupling.

In accordance with various embodiments of the invention, prior to receiving a custom circuit design from a customer, an ASIC vendor will design one or more via masks. Upon receipt of the custom circuit design, the vendor will design the masks required for the custom conducting layers. The vendor will also select one or more predefined via masks for use in forming the via layers, which will be interspersed with the custom conducting layers.

A predefined via mask in accordance with an embodiment of the invention can be used with many varieties of ASICs including gate arrays, standard cells, and module based arrays. Using predefined via masks in accordance with various embodiments of the invention can significantly reduce the costs of mask programming. For instance, since custom via masks generally cost two times as much as custom conducting layer masks, by eliminating the custom via masks and replacing them with predefined ones, the cost can be reduced by about 66%. Alternatively, more custom conducting layers can be added, for instance, four custom conducting layers can be made for the price of two custom conducting layers plus one custom via layer when using an embodiment of the invention. In addition, unlike FPGAs, because the vias are not coupled unnecessarily in any conducting layer routes in conducting layers above or below, but are only coupled where needed, capacitive loading is minimized and performance enhanced. Predefined via layers may further reduce cross-talk and minimize other deep-submicron effects.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

The invention claimed is:

1. A via mask for use in forming custom integrated circuits, comprising:
   a plurality of parallel predefined via tracks;
   wherein each via track includes a plurality of vias; and
   wherein the plurality of parallel via tracks are spaced so that at least two conductor tracks can be placed between two via tracks.

2. The via mask of claim 1, wherein:
   at least one of the vias in the plurality of vias is a double via.

* * * * *